United States Patent

Potember et al.

[11] Patent Number: 5,216,661
[45] Date of Patent: Jun. 1, 1993

[54] ELECTRON DENSITY STORAGE DEVICE USING A STM

[75] Inventors: Richard S. Potember, Dayton, Md.; Shoji Yamaguchi, Kobe, Japan; Carla A. Viands, Adelphi, Md.

[73] Assignee: The Johns Hopkins University, Baltimore, Md.

[21] Appl. No.: 924,709

[22] Filed: Aug. 4, 1992

Related U.S. Application Data

[63] Continuation-in-part of Ser. No. 733,770, Jul. 20, 1991, Pat. No. 5,161,149.

[51] Int. Cl.⁵ .............................................. G11B 9/08
[52] U.S. Cl. .................................... 369/126; 369/101; 365/151; 250/306; 250/307; 430/270; 430/495; 430/945
[58] Field of Search ..................... 365/174, 151, 118; 369/126, 101; 250/306, 307; 430/270, 495, 945

[56] References Cited

U.S. PATENT DOCUMENTS 4,885,368 12/1989 Huenig et al. .................. 544/347

FOREIGN PATENT DOCUMENTS 0272935 6/1988 European Pat. Off. ............ 369/126

OTHER PUBLICATIONS

The Scanning-Probe Microscope Book, copyright 1990, Burleigh Instruments.
An Optical Phase Transition in thin films of highly conducting charge transfer salts (by Yamaguchi et al.-→Jun. 1991).
Aromatic/quinoid systems: principles and applications (by Hunig—1990).

Primary Examiner—Stuart S. Levy
Assistant Examiner—Joseph A. Rhoa
Attorney, Agent, or Firm—Mary Louise Beall

[57] ABSTRACT

The invention is a method and device providing very high density information storage on an organomellic DCNQI charge transfer data storage medium. The medium is switched from one state to another through the application of an electric field to the medium by the probe tip of a scanning tunneling microscope resulting in an observable change in the electron density of the surface of the medium.

33 Claims, 4 Drawing Sheets

ELECTRON DENSITY STORAGE DEVICE USING A STM

STATEMENT OF GOVERNMENTAL INTEREST

The Government of the United States of America has rights in this invention pursuant to Contract No. N00039-89-C-0001 awarded by the Department of the Navy.

This is a continuation-in-part of U.S. Ser. No. 07/733,770 filed Jul. 20, 1991, now U.S. Pat. No. 5,161,149.

BACKGROUND OF THE INVENTION

This invention concerns a device and method capable of providing high density information storage. It is related to a series of commonly assigned patents using charge transfer complexes in information storage technology. These are incorporated by reference and are as follows:

U.S. Pat. No. 4,371,883—Current Controlled Bistable Electrical Organic Thin Film Switching Device;

U.S. Pat. No. 4,507,672—Method of Fabricating a Current Controlled Bistable Electrical Organic Thin Film Switching Device;

U.S. Pat. No. 4,574,366—Optical Storage and Switching Devices Using Organic Charge Transfer Salts;

U.S. Pat. No. 4,652,894—An Electrical Organic Thin Film Switching Device Switching Between Detectably Different Oxidation States;

U.S. Pat. No. 4,663,270—Multistate Optical Switching and Memory Using an Amphoteric Organic Charge Transfer Material;

U.S. Pat. No. 4,684,598—An Enhanced Optical Sensitive Medium Using Organic Charge Transfer Materials to Provide Reproducible Thermal/Optical Erasure; and U.S. Pat. No. 4,731,756—Optical Storage and Switching Devices Using Organic Charge Transfer Salts (Cont.).

All of these patents are based on the electron transfer mechanism of charge transfer complexes, in particular the Metaltetracyanoquinodimethane (TCNQ) complexes.

U.S. Pat. No. 4,885,368, invented by Siefried Huenig, et al, corresponds to German patent DE 3522232 entitled "Radical Ion Salts". This reference describes N,N'-dicyanoquinonediimines (DCNQI) compositions similar to those used in the present invention.

Siegfried Huenig is also the author of a scientific paper entitled "Aromatic/Quinoid Systems: Principles and Applications", *Pure & Appl. Chem.*, Vol. 62, No. 3, pp. 395-406, 1990. In this paper, the abstract and section 5 discuss DCNQI compositions. However, these relate charge transfer activities in solution and not in a solid film.

A scientific paper entitled "An Optical Phase Transition in Thin Films of Highly Conducting Charge-Transfer Salts: silver and copper, 2,5-dimethyl-N,N'-dicyanoquinonediimine", *Synthetic Metals*, published Aug. 14, 1991 describes work performed by the three inventors of the present invention, Yamaguchi, Viands and Potember.

In U.S. Pat. No. 4,916,688 entitled "Data Storage Method Using State Transformable Materials", scanning tunneling microscopy is used to selectively melt discrete areas of a state transformable film. This is an amorphous-to-crystalline phase transformation. The thin film is a metal/metal compound material as opposed to a nonstochiometric alloy.

OBJECTS OF THE INVENTION

It is an object of the present invention to produce a high density information storage device based on measuring differences in electron density on the surface of an organometallic charge transfer complex.

Another object of the invention is a device and method for high density information storage and retrieval using technology presently available but not restricted to a scanning tunneling microscope.

It is also an object of the invention to produce a high density information storage device able to store information on a molecular basis, i.e. angstrom resolution.

SUMMARY OF THE INVENTION

It is a purpose of the invention to provide switching of a charge transfer complex from one impedance state to another impedance state by applying an electric field. The magnitude of the applied field required to effect switching depends on the type of charge transfer complex used as the information storage medium. This is called threshold voltage and is fully discussed in "A Current Controlled Electrically Switched Memory State in Silver and Copper-TCNQ $F_4$ Radical Ion Salts", Potember and Poehler, *Synthetic Metals*, 4 (1982) 371-380. See also U.S. Pat. Nos. 4,371,883 and 4,652,894 mentioned above. In accordance with the invention, switching back to the high impedance state can be achieved by applying an electric field to reform the original charge transfer complex.

In the present invention, the electric field is applied to a very small area, close to or at molecular scale typically 10-20 angstroms. When the electric field exceeds a certain threshold, it causes an observable change in the electron density of the surface of the charge transfer film. This is the "write" or recording mode for storing binary data in the information storage device. In the "read" mode, the variations in the electron density are measured to retrieve the data. The "erase" mode removes the variations in electron density produced by the "write" mode by applying an electric field of the same intensity as the "write" field but of the opposite polarity. This is manifested in the phase transition or switching operation of the device.

The data storage medium is a charge transfer complex, an organic thin film, solid state composition typically comprised of copper or silver complexed with tetracyanoquinodimethane (TCNQ), tetracyanonaphthoquinodimethane (TNAP), tetracyanoethylene (TCNE), dichlorodicyanobenzoquinone (DDQ), or derivatives of TCNQ such as those listed in the above mentioned U.S. Pat. No. 4,574,366.

These derivatives are defined by the notations:
TCNQ(OMe)
TCNQ(OMe)$_2$
TCNQ(OMe)(OEt)
TCNQ(OMe)(O-i-Pr)
TCNQ(OMe)(O-i-Bu)
TCNQ(OEt)
TCNQ(OEt)(SMe)
TCNQ Cl
TCNQ Br
TCNQ ClMe
TCNQ BrMe TCNQ IMe
TCNQ I
TCNQ(OMe)$_3$
TCNQ(CN)$_2$
TCNQ(Me)
TCNQ(Et)
TCNQ(i-Pr)
TCNQ(i-Pr)$_2$.

Another charge transfer complex having a core chemical structure similar to that of TCNQ is N,N'-dicyanoquinonediimine (DCNQI). Metal bis-DCNQI complexes and especially metal 2,5-substituted DCNQI charge transfer complexes are also useful as the data storage medium. The following compounds may be used:

2,5-dimethyl-N,N'-dicyanoquinonediimine
2,5-diethyl-N,N'-dicyanoquinonediimine
2,5-dipropyl-N,N'-dicyanoquinonediimine
2,5-dichloro-N,N'-dicyanoquinonediimine
2,5-dibromo,N,N'-dicyanoquinonediimine
2,5-diiodo-N,N'-dicyanoquinonediimine
2-methyl-5-chloro-N,N'-dicyanoquinonediimine
2-methyl-5-bromo-N,N'-dicyanoquinonediimine
2-methyl-5-iodo-N,N'-dicyanoquinonediimine
2,5-dimethoxy-N,N'-dicyanoquinonediimine
2-methoxy-5-chloro-N,N'-dicyanoquinonediimine
2-methoxy-5-bromo-N,N'-dicyanoquinonediimine
2-methoxy-5-iodo-N,N'-dicyanoquinonediimine It is supposed that the electron density or the switching of the complex occurs according to the following field induced reversible neutral-ionic transition:

$$[M^+(TCNQ^-)]_n \rightarrow M^0 + (TCNQ^0)_x + [M^+(TCNQ^-)]_{n-x} \quad \text{Eq. (1)}$$

The metal may be Ag, Cu, Ni, Co, Fe, Mg, Zn, Cd, Pt, Ir, Pd, Os or Rh for the TCNQ complexes and Ag, Cu, K, Na, Li or Tl for the DCNQI complexes.

The limit for the storage density for known optical systems is approximately $10^8$ data bits/cm$^2$. According to the subject invention, the storage density unit is much higher: at least $10^{10}$ data bits/cm$^2$ of storage medium up to $10^{14}$ bits/cm$^2$.

DESCRIPTION OF THE INVENTION

Figure 1:
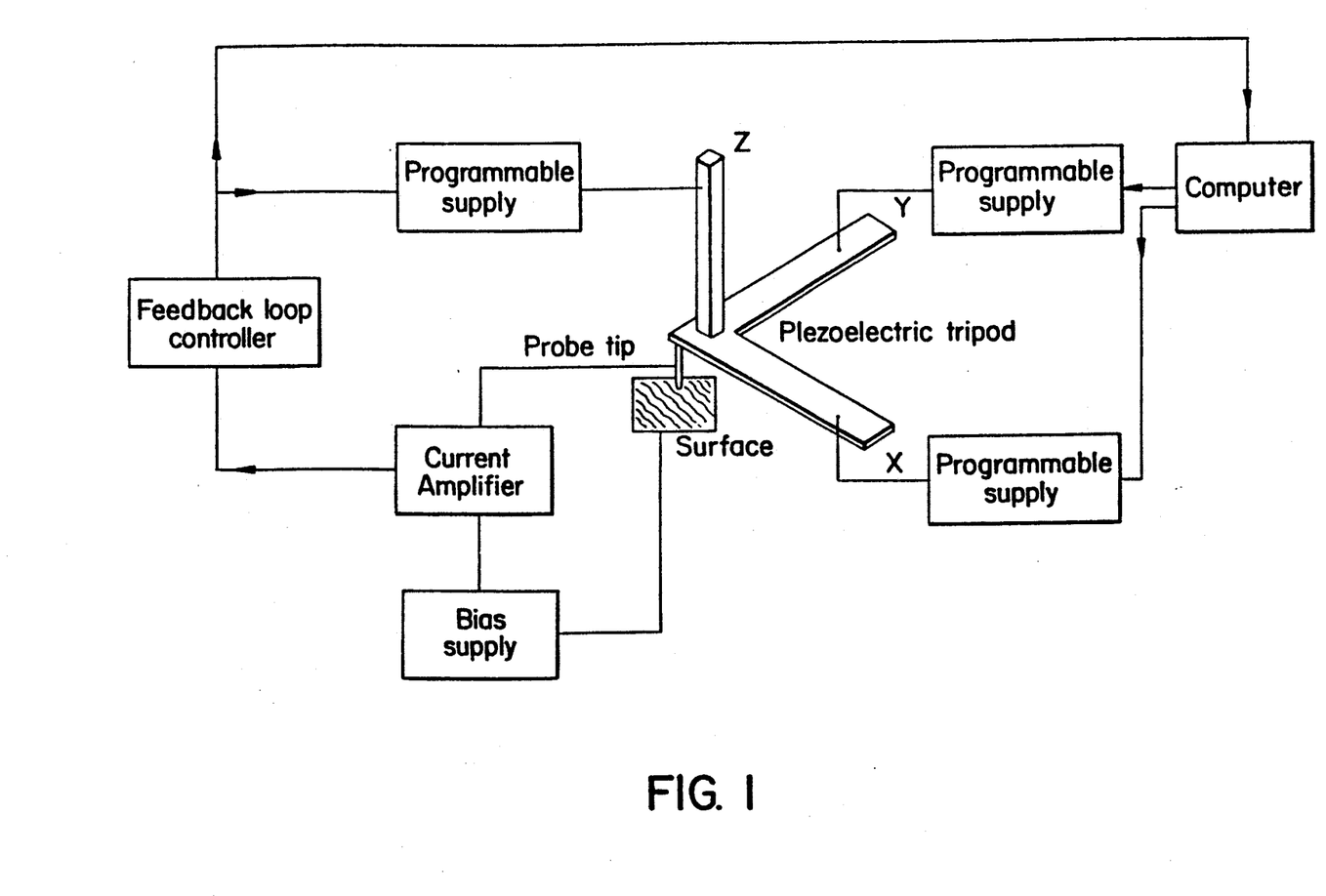
FIG. 1 is a block diagram of the apparatus of the invention.

As shown in FIG. 1 the apparatus of the invention includes a surface of a charge transfer film mounted on a substrate. Typically the film is 10–10,000 angstroms thick and optimally 500–5000 angstroms. In close proximity is located the probe tip of the scanning tunneling microscope. A tunneling voltage is supplied to the surface by the bias voltage supply and a tunneling current is induced between the probe tip and the film surface if the gap separation between tip and film surface is small enough to have tunneling effect. The gap is on the order of 1 nanometer. An explanation of the operation of a scanning tunneling microscope is described in an attached booklet entitled "The Scanning-Probe Microscope Book", published by Burleigh Instruments, Inc., copyright 1990.

The piezo electric tripod actuator comprises the registration system for the device controlling movement of the probe tip in the X, Y and Z directions as it moves over the surface of the charge transfer complex film. These movements, in turn are controlled by the computer. Other registration mechanisms such as a tube, bimorph or multilayer type piezo actuator, may also be used.

According to the invention, changes in the surface electron density of an organometallic composition are used as a means to store binary data. An electric field is generated to drive the solid-state chemical reaction of equation 1 producing changes in the local electron density of copper or silver TCNQ films grown on several different substrates. In the particular example of the invention, the field is generated at the tunneling probe tip of a scanning tunneling microscope (STM) located in close proximity to the film, but not touching. The size of the gap between the probe tip and the surface depends on whether the STM is operating in the constant height or constant current mode discussed below. The gap corresponds to the Z direction of the piezoelectric tripod discussed above.

The instrumentation measures the tunneling current at many points on the film surface and this current is exponentially proportional to the Z distance. The images created are digital computer images created by assembling a plurality of Z distance measurements along the X and Y axes. Note that the X, Y and Z distances are three directional and perpendicular to one another.

Figure 2A:
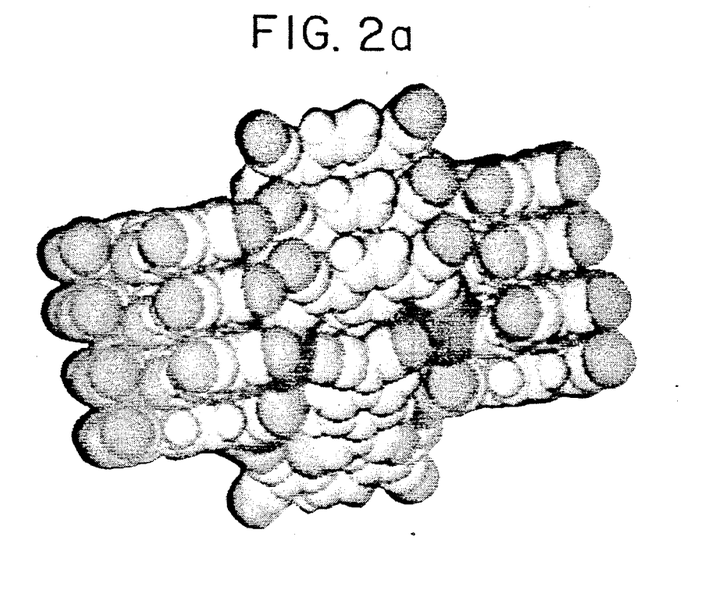
FIG. 2a is photograph of a molecular model of silver TCNQ and FIG. 2b is an STM image of a silver TCNQ film.
Figure 2B:
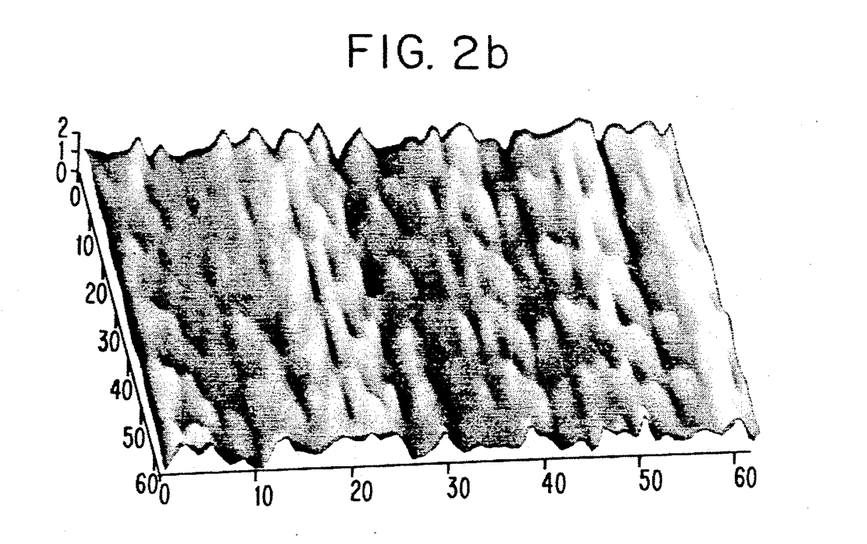

Images produced by the STM are used to observe the results of the chemical reaction of equation 1. Binary data is observed and stored as one or more high contrast light and dark regions. These high contrast images, having up to nanometer level resolution, can be assigned to the density of electric charges on the metal TCNQ charge transfer film. It has been shown that when the ac crystalographic plane of metal TCNQ is imaged, the benzene and cyano structures are bright areas with the benzene ring having the highest contrast. FIG. 2a is a model shown in the ac plane of a silver TCNQ molecule with the light blue atoms representing hydrogen, the dark blue nitrogen, the yellow silver and the white carbon. FIG. 2b is an STM image of a film of silver TCNQ on highly oriented pyrolytic graphite (HOPG). The normal orientation of this film is in the ac plane. Note the benzene rings made of white carbon atoms at the center of the molecule model correspond to the bright white stripe in the STM image while the cyano groups, including the dark blue nitrogen atoms correspond to the darker portion of the image. The electron density of benzene rings is greater than that of the cyano groups and this is demonstrated by the presence of the bright stripe contrasting with the dark blue in the STM image of FIG. 2b. Note that the colors are not true colors but are colors generated by the computer to enhance the image.

Figure 3A:
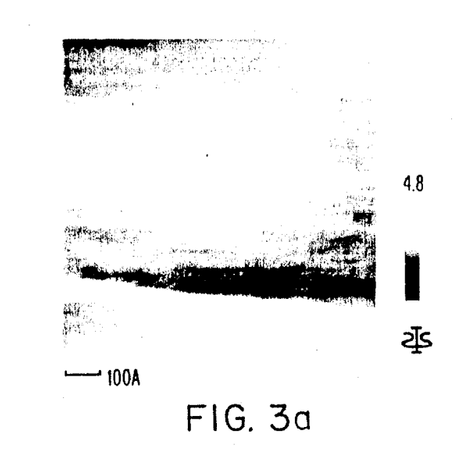
FIG. 3 is a series of images showing the progressive changes in electron density of a silver TCNQ film under the application of an electric field with the passage of time.
Figure 3B:
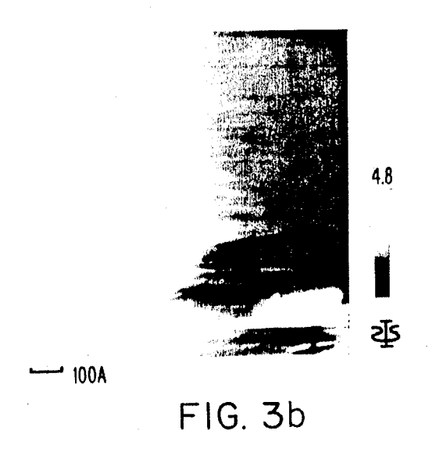
Figure 3C:
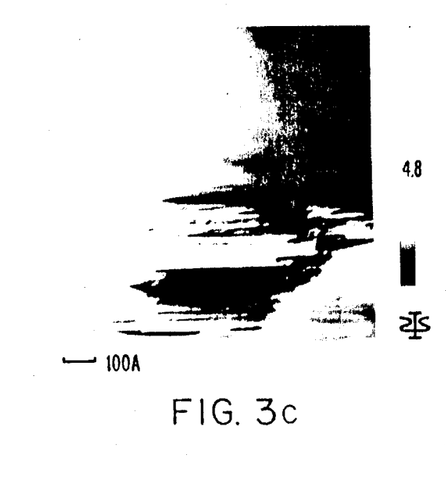
Figure 3D:
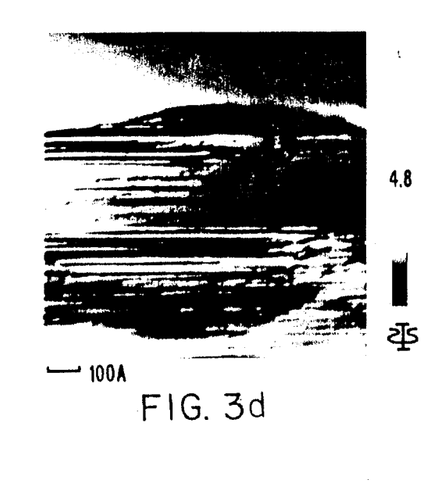

In order to "write" or record data bits for storing in an information storage device, the switching threshold of the metal complex, TCNQ generally in the range of $10^3$–$10^4$ V/cm, must be exceeded. The Z distance must be constant. The threshold field is the electric field between the probe tip and the surface of the substrate. It is equal to the voltage applied to the surface of the film divided by the thickness of the film in addition to the tunneling gap distance and is expressed in volts per centimeter. Applying a field greater than the threshold field drives the reaction of equation 1 to the right causing the electron density to change. The electrons progressively move with time to form increasing amounts of neutral TCNQ and neutral metal. This is called "writing" and is shown in the series of photographs of FIG. 3. FIG. 3a is an STM image of a film of AgTCNQ on a KBr substrate at an X,Y scale of 1000×1000 angstroms. FIGS. 3a, 3b, 3c and 3d are images made at 0, 63, 181 and 237 seconds of exposure to the switching field which is approximately $10^5$ V/cm. The scanning voltage applied to the film for imaging is $-2.01$ V and the tunneling current is 0.9n A. In these images, the dark portion is neutral TCNQ and the white portion is neutral silver. Note the high contrast images of 3b and 3c. For writing according to the invention, the applied field is generally in the range of $10^4$–$10^6$ V/cm. All four images of FIG. 3 are on the scale of 1000×1000 angstroms, and shows details in the Z direction of 4.8 angstroms.

If the STM is used to apply the voltage pulse, the feedback circuit shown in FIG. 1 must be turned off if the width is long enough to cause undesirable feedback from feedback control. Note that feedback control is used for "read" mode only. If shorter pulse is used, these feedback problems are minimized. See previously cited U.S. Pat. Nos. 4,371,883 and 4,652,894 for discussion of pulse width and applied voltage.

Although FIG. 3 represents only one location on the film, by using the computer controlled piezoelectric tripod, the probe tip can be made to move or scan the in X and Y directions recording a plurality of binary data bits. Since a high contrast image is produced, the dark and light areas correspond to 0 and 1 or vice versa.

Figure 4A:
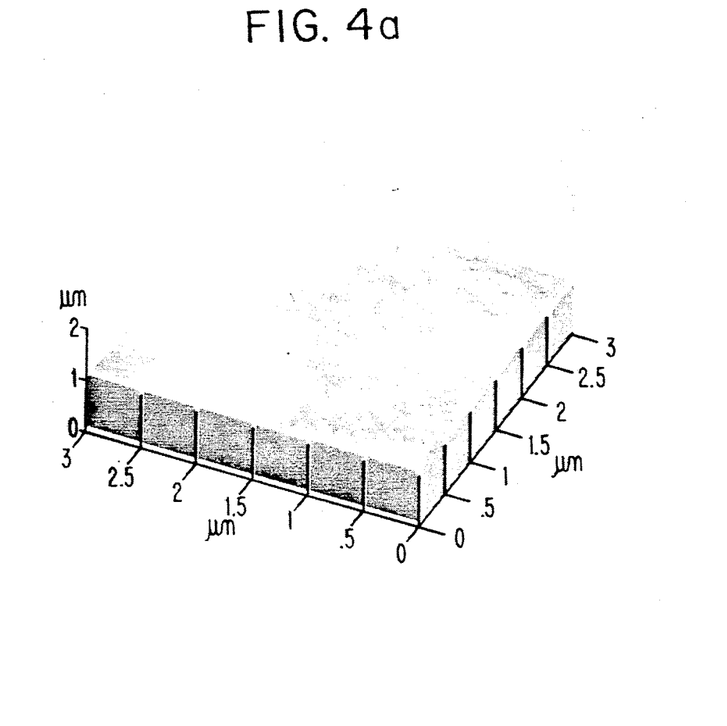
FIG. 4a is an image of a copper TCNQ film before the application of a "write" mode electric field and FIG. 4b is the same film after "writing".
Figure 4B:
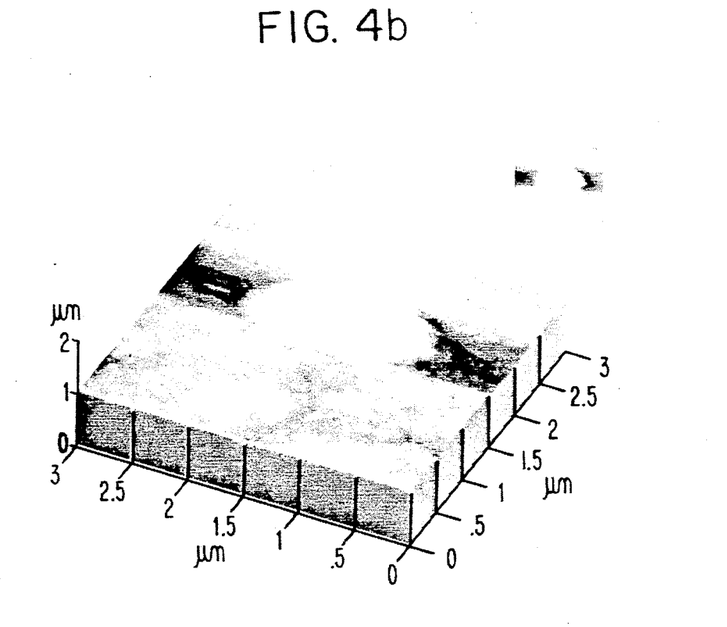

In "writing" on the data storage medium, the surface of the charge transfer complex film is changed and is observed by electron density changes due to the phase change of the complex. FIG. 4a is a three dimensional STM image of a copper TCNQ film before "writing" and FIG. 4b is the image after writing. The white spot in FIG. 4b is a hillock 4000 angstroms above the surface of the film caused by a pile of electrons which moved in response to the "writing" voltage. These two images are on the scale of 3×3 microns and shows details in the Z direction of 2 microns. The "writing" voltage in this particular example is a 2 V pulse.

To "read", the field must be lower than the switching threshold of between $10^3$–$10^4$ V/cm and the STM is operated in its normal scanning conditions. Depending on the material scanned, STM requires at least a bias in the range of 0.1–1.0 V to obtain a tunneling current (typically in the range of 0.5 to 5.0 nA or approximately 1 nA). There are two methods to "read" using the STM: the constant height mode and the constant current mode.

In the constant height mode, the probe tip is maintained at the Z distance as it scans over the film surface. The current flowing between the tip and the surface is measured with the higher portions of the surface producing the greater current. These higher portions have a greater electron density than the lower portions and thus provide the ability to indicate whether the particular data spot has been "switched". As the STM scans over the surface of the film, it can read a plurality of binary data spots.

In the constant current mode, the probe tip is maintained at a fixed gap distance above the surface of the film. In this way, the current between the probe tip and the surface is always the same but the Z distance changes according to the topography of the film. Changes in the Z distance indicate spots where the electron density has increased or decreased. Again, as the STM scans over the surface of the film, it can read a plurality of binary data spots.

To "erase", a voltage pulse is applied to the data spot returning it to its original charge transfer state. The Z distance must be constant. It is particularly advantageous to apply a pulse opposite in polarity but equal in value to the writing pulse using the STM. This drives the reaction of equation 1 to the left and causes the electron density to change again. This "erasure" can also be "read" as described above.

SPECIFIC EXAMPLE

A $+2$ V pulse creating an electric field on the order of V/cm is applied via an STM probe tip to a 2000 angstroms thick film of copper TCNQ on an HOPG substrate suitably mounted within and connected to an STM. This film was deposited on the substrate by the solid-state deposition process. As shown in FIG. 4b, this produces a high contrast bright data spot approximately 1 micron in diameter and a height of 4000 angstroms above the surface of the film.

The thus "written" spot is "read" using standard STM scanning conditions. In this particular situation, the voltage applied through the tip is $+0.302$ V. The tunneling current is 2.78 nA. The visual manifestation of "reading" is the image created by the STM, in this case, FIG. 4b.

The written spot is erased by the application of a $-2$ V pulse applied under the same conditions as for writing.

Since the shift in electron density is demonstrated by changes in the topography of the charge transfer film, it is necessary for the film to be as smooth as possible. Although the system of the invention will operate using charge transfer films deposited by methods such as dipping, spraying, vapor deposition and vacuum deposition, the latter method, vacuum deposition is preferred because it produces the smoothest film.

The vacuum deposition or solid-state deposition process allows a highly oriented thin film of organometallic charge transfer complex to be deposited. In this process, the neutral organic portion of the complex is vacuum deposited or sublimed onto a suitable substrate supporting a thin film of the metal portion of the complex. In a second step, the charge transfer complex is formed by heating which initiates an electron transfer reaction between the metal and organic layers.

There are several possible variations to the solid state diffusion process including :

1. The metal electron donor is deposited on a substrate, then exposed to a molecular beam of organic electron acceptor while being held at a suitable temperature depending on the material. For copper TCNQ, the temperature is in the range of 40°–80° C.

2. The metal donor and organic acceptor are simultaneously deposited onto a substrate maintained at room temperature or above.

3. A layer of organic acceptor is deposited on a substrate, followed by a layer of metal donor. Heating may be required to complete the reaction.

4. Alternating layers of metal donor and organic acceptor are deposited on a substrate and then heated.

In the case of DCNQI, the film may also be deposited using a vacuum deposition or solid-state deposition process. However, because some DCNQI complexes (for example, 2,5-dimethyl-DCNQI and 2,5-diethyl-DCNQI) have lower sublimation temperatures than the TCNQ derivatives, a film preparation technique using a solution-growth mechanism combined with solid-state processing techniques may be used. This allows DCNQI films to be deposited at room temperature and avoids the problem of having the DCNQI sublimate away before reacting with copper.

As an example of this process, successive depositions of copper or copper(I) iodide and 2,5-dimethyl-N,N'-DCNQI are deposited on a substrate, producing a yellow, double layered film. When the film is exposed to acetonitrile vapor, a charge transfer occurs from copper to 2,5-dimethyl-N,N'-DCNQI, producing a blue-black film.

As in the case of TCNQ, the DCNQI charge complex film is switched for the writing step by applying an electric field to a very small localized portion of the surface of film using the STM probe tip. This electric field must exceed the threshold field strength for the film.

In a specific example, a $+2$ V pulse creating an electric field on the order of $2 \times 10^5$ V/cm is applied via an STM probe tip to a 1000 angstrom thick film of copper bis 2,5-dimethyl DCNQI on an HOPG substrate suitably mounted within and connected to an STM. The film was deposited on the substrate by the solid-state deposition process and exposed to acetonitrile. This produces a high contrast dark data spot 300 angstroms in diameter and 200 angstroms below the surface of the film.

The thus "written" spot is "read" using standard STM scanning conditions. In this particular situation, the voltage applied through the tip is $-0.041$V. The tunneling current is 1.024 nA. The visual manifestation of "reading" is the image created by the STM.

The substrate material is required to be flat and atomically or close to atomically smooth. Generally, a greater degree of smoothness is required for small data storage spots than for large one. The substrate must also posses sufficient conductivity to insure a stable tunneling current. Examples of suitable substrates are:

1. Highly Oriented Pyrolytic Graphite (HOPG) available from Union Carbide Corp.

2. Conductive or semiconductive metal dichalcogenides generally described as $MX_2$ or MX wherein X is the chalcogen element and M is the metal and further where M is Mo, W, Ta, Nb, Sn, Ti, Zr, Re, In, Pt, Hf, V, Mn, Fe, Rh, Ir, Ni, Pd, Co, Tc or Pb and X is S, Se or Te. An example is $MoS_2$.

3. Semiconductor or doped semiconductor wafers such as Ge and doped Si.

4. Metal films deposited on a flat insulating substrate such as Mica, NaCl, KCl, KBr, $CaF_2$, quartz, sapphire and glass and the metal is Au, Ag, Pt, Rh, Pd, Ir, Cu or Ni. The substrate made of Ag or Cu deposited on mica is particularly useful because the metal layer works not only as the conductive electrode but also as source donor. More than 2 metals can be used as a metal film.

5. Mechanically polished metal crystal, especially silver or copper.

The preferred substrate is HOPG.

Various computer means, feed back systems and software are required to operate the system of the present invention. The STM software is available from Park Scientific Instruments. The components used in this particular system are also available from Park Scientific Instruments and include: an SPC-400 Scanning Microprobe Central Control Unit, an STM-SU2-210 Scanning Tunneling Microprobe Control Module, an SU2-100 UHV STM Head, an SAI-100 Ambient STM Head, and an SAI/BD2-110 Ambient STM/SFM Base. These are all controlled by a Hewlett-Packard HP 340C Graphic Work Station. However, these may be replaced by any comparable device(s) able to localize an applied voltage to a very small area on the order of nanometer scale and preferably lower. This means that a separate pulse generator may be used to "write" and "erase".

The preferred probe tip is electrochemically etched Pt/Ir or Pt alone. Another useful tip is made of electrochemically etched W. Au, Ag, Cu and Ni tips may be used.

The invention described is not intended to be limited to the embodiments disclosed but includes modifications made within the true spirit and scope of the invention.

What is claimed is:

1. A method for writing, reading and erasing data bits in an information storage device comprising:
   providing a data storage medium comprising a substrate with a film of DCNQI organometallic charge transfer complex material thereon, said film having a thickness and a surface provided with a smooth topography, said film having a threshold field strength;
   writing a data bit by applying a first electric field to a very small localized portion of the surface of the film, said field exceeding the threshold field strength for the film and changing the electron density of the localized portion of the film;
   reading the data bit by scanning tunneling microscope applying a second electric field less than the threshold field strength for the film to detect the change in electron density of the localized portion;
   erasing the data bit by applying a third electric field to the localized portion, said third field having the opposite polarity from the first field applied for writing and said third and first fields having equal intensities; and
   calculating said first and third fields in accordance with a thickness of the organometallic charge complex.

2. A method according to claim 1, wherein the change in electron density causes a change in the topography of the charge transfer film.

3. A method according to claim 1, wherein the electron density change produces a high contrast spot on the surface of the charge transfer complex material.

4. A method according to claim 1, wherein the applied erasing field returns the charge transfer complex material to its original state.

5. A method according to claim 1, wherein the electric fields for writing, reading and erasing are each created by a voltage pulse applied through the probe of the scanning tunneling microscope, said probe located at a gap distance from the surface of the film.

6. A method according to claim 5, including calculating the first and third electric fields by dividing the voltage applied through the probe tip by a sum of the thickness of the film plus the gap distance.

7. A method according to claim 1, wherein the charge transfer complex is a metal complexed with one of:
2,5-dimethyl-N,N'-dicyanoquinonediimine
2,5-diethyl-N,N'-dicyanoquinonediimine
2,5-dipropyl-N,N'-dicyanoquinonediimine
2,5-dichloro-N,N'-dicyanoquinonediimine
2,5-dibromo,N,N'-dicyanoquinonediimine
2,5-diiodo-N,N'-dicyanoquinonediimine
2-methyl-5-chloro-N,N'-dicyanoquinonediimine
2-methyl-5-bromo-N,N'-dicyanoquinonediimine
2-methyl-5-iodo-N,N'-dicyanoquinonediimine
2,5-dimethoxy-N,N'-dicyanoquinonediimine
2-methoxy-5-chloro-N,N'-dicyanoquinonediimine
2-methoxy-5-bromo-N,N'-dicyanoquinonediimine
2-methoxy-5-iodo-N,N'-dicyanoquinonediimine.

8. A method according to claim 7, wherein the metal is selected from the group consisting of silver, copper, potassium, sodium, lithium and thallium.

9. A method according to claim 1, wherein the charge transfer complex is copper bis-DCNQI.

10. A method according to claim 1, wherein the charge transfer complex is silver bis-DCNQI.

11. A method according to claim 1, wherein the substrate is highly oriented pyrolitic graphite (HOPG).

12. A method according to claim 1, wherein the substrate is a conductive or semiconductive metal dichalcogenide having a formula $MX_2$ wherein M is a metal selected from the group consisting of Mo, W, Ta, Nb, Sn, Ti, Zr, Re, In, Pt, Hf, V, Mn, Fe, Rh, Ir, Ni, Pd, Co, Tc and Pb and X is a chalcogenide selected from the group consisting of S, Se and Te.

13. A method according to claim 1, wherein the substrate is selected from the group consisting of a mechanically polished metal crystal and a semiconductor wafer.

14. A method according to claim 1, wherein the substrate is a metal film deposited on a flat insulating material and further wherein the metal is one of Au, Ag, Pt, Rh, Pd, Ir, Cu and Ni and the flat material is one of mica, NaCl, KCl, KBr, $CaF_2$, quartz, sapphire and glass.

15. A method according to claim 1, wherein the threshold field strength is in the range of $10^3$–$10^4$ V/cm, and the writing field is in the range of $10^4$–$10^6$ V/cm.

16. A method according to claim 1, wherein the data storage medium comprises a 1000–2000 angstrom thick film of copper bis-DCNQI on an HOPG substrate.

17. A method according to claim 1, wherein the data storage medium is prepared according to a solid state vacuum deposition process.

18. A method according to claim 1, wherein the data storage medium is prepared according to a solid state vacuum deposition process in conjunction with exposure to acetonitrile.

19. A method according to claim 1, wherein the change in electron density is detected by the scanning tunneling microscope operating in the constant height mode.

20. A method according to claim 1, wherein the change in electron density is detected by the scanning tunneling microscope operating in the constant current mode.

21. A device for writing, reading and erasing data bits in an information storage device comprising:
a storage medium including a substrate and a film of DCNQI organometallic charge transfer complex material thereon, said film having a flat surface;
scanning tunneling microscope means for applying a first electric field to the surface of the medium which is greater than a threshold field strength of the film, so that information is written on the medium; said scanning tunneling microscope means also including:
(a) means for reading the information; and
(b) means for applying a second electric field to the surface of the medium so that the information is erased;
wherein the second electric field has an intensity equal to the first electric field but a polarity opposite the polarity of the first electric field; and
field generating means for generating the first and second fields in accordance with a thickness of the film.

22. A device according to claim 21, wherein the charge transfer complex is a metal complexed with one of:
2,5-dimethyl-N,N'-dicyanoquinonediimine
2,5-diethyl-N,N'-dicyanoquinonediimine
2,5-dipropyl-N,N'-dicyanoquinonediimine
2,5-dichloro-N,N'-dicyanoquinonediimine
2,5-dibromo,N,N'-dicyanoquinonediimine
2,5-diiodo-N,N'-dicyanoquinonediimine
2-methyl-5-chloro-N,N'-dicyanoquinonediimine
2-methyl-5-bromo-N,N'-dicyanoquinonediimine
2-methyl-5-iodo-N,N'-dicyanoquinonediimine
2,5-dimethoxy-N,N'-dicyanoquinonediimine
2-methoxy-5-chloro-N,N'-dicyanoquinonediimine
2-methoxy-5-bromo-N,N'-dicyanoquinonediimine
2-methoxy-5-iodo-N,N'-dicyanoquinonediimine.

23. A device according to claim 22, wherein the metal is selected from the group consisting of silver, copper, potassium, sodium, lithium and thallium.

24. A device according to claim 21, wherein the charge transfer complex is copper bis-DCNQI.

25. A device according to claim 21, wherein the charge transfer complex is silver bis-DCNQI.

26. A device according to claim 21, wherein the substrate is highly oriented pyrolitic graphite (HOPG).

27. A device according to claim 21, wherein the substrate is one of a conductive and a semiconductive metal dichalcogenide having a formula $MX_2$ wherein M is a metal selected from the group consisting of Mo, W, Ta, Nb, Sn, Ti, Zr, Re, In, Pt, Hf, V, Mn, Fe, Rh, Ir, Ni, Pd, Co, Tc and Pb and X is a chalcogenide selected from the group consisting of S, Se and Te.

28. A device according to claim 21, wherein the substrate is selected from the group consisting of a mechanically polished metal crystal and a semiconductor wafer.

29. A device according to claim 21, wherein the substrate is a metal film deposited on a flat insulating material and further wherein the metal is one of Au, Ag, Pt, Rh, Pd, Ir, Cu and Ni and the flat material is one of mica, NaCl, KCl, KBr, $CaF_2$, quartz, sapphire and glass.

30. A device according to claim 21, wherein the change in electron density is detected by scanning tunneling microscope means operating in the constant height mode.

31. A device according to claim 21, wherein the change in electron density is detected by the scanning tunneling microscope means operating in the constant current mode.

32. A device according to claim 21, wherein the data storage medium has a thickness in the range of 10–10,000 angstroms.

33. A device according to claim 21, wherein the data storage medium has a thickness in the range of 500–5000 angstroms.

* * * * *